United States Patent [19]

Bayard

[11] 4,119,768
[45] Oct. 10, 1978

[54] PHOTOVOLTAIC BATTERY

[75] Inventor: Michel Lucien Bayard, Dallas, Tex.

[73] Assignee: Texas Instruments Incorporated, Dallas, Tex.

[21] Appl. No.: 813,920

[22] Filed: Jul. 8, 1977

[51] Int. Cl.² ............................................. H01L 31/04
[52] U.S. Cl. ................................ 429/111; 136/89 NB; H01M/6/30
[58] Field of Search .................... 429/111; 136/89 NB; 250/211 J, 212; 357/30

[56] References Cited

U.S. PATENT DOCUMENTS

| 3,057,945 | 10/1962 | Rinnovatore et al. | 429/111 X |
| 3,247,427 | 4/1966 | Kallmann et al. | 136/89 X |

Primary Examiner—John H. Mack
Assistant Examiner—Aaron Weisstuch
Attorney, Agent, or Firm—James T. Comfort; Rene'E. Grossman; William E. Hiller

[57] ABSTRACT

A photovoltaic battery in which a body of a photoactive material is disposed between first and second layers of ionically conductive material. The second layer is relatively high in ionic conductivity as compared to the first layer. An electric field oriented toward said second layer is induced through the photoactive body by virtue of the difference in chemical potential between the first and second layers of ionically conductive material. An electronically conductive body is disposed on the side of the first layer opposite from the photoactive body. The first layer in conjunction with the electronically conductive body acts as the positive electrode, the second layer acts as the negative electrode, and the photoactive body disposed therebetween acts as a solid electrolyte in the battery. When the photoactive body is exposed to visible light, it generates positive ions which are attracted to the negative electrode and electrons which are trapped by the electronically conductive body of the composite positive electrode. Charging of the battery thereby occurs as a result of the reaction between the photoactive body and light photons. During discharge of the battery, positive ions leave the negative electrode and enter the solid electrolyte comprising the photoactive body.

13 Claims, 4 Drawing Figures

PHOTOVOLTAIC BATTERY

BACKGROUND OF THE INVENTION

This invention generally relates to photovoltaic cells and, in particular, to a photovoltaic cell which includes a photoactive body sandwiched between first and second electrode layers of ionically conductive material, wherein the photoactive body is effective to generate electric energy in response to its exposure to a light source, while enabling the storage of energy in the cell which comprises a photovoltaic battery.

One of the significant problems encountered with solar cells is the storage of energy produced by these cells. It is desirable to have storage capabilities associated with solar cells since these cells are able to produce more energy than is needed at any particular time. Thus, a solar cell in a home heating application should be able to store the energy collected during the day for use overnight. Conventional silicon or gallium arsenide cells must be connected to storage batteries since they do not have intrinsic storage capabilities. Many examples utilizing this principle could be cited, one such example being shown on page 26 of the publication *Machine Design*, Vol. 46, No. 11, published May 2, 1974. The need for solar cells with higher power/weight and power/size ratios is especially acute in the areas of satellite communication and jet propulsion, since smaller and lighter cells are necessary for improved efficiency in launching and performance.

Another major problem concerning the efficiency of solar cell performance is the problem of recombination. In a typical silicon or gallium arsenide solar cell, a fraction of the photoelectrically produced minority carriers recombine before reaching the PN junction of the solar cell, thus significantly reducing the available power. Approaches to a solution of this problem including the introduction of a graded distribution of impurities into the P-region near the PN junction so as to induce an electric field which tends to force more electrons toward the PN junction. Other approaches center around modification of the PN junction itself, as exemplified by U.S. Pat. No. 3,682,708, issued to A. I. Bennett. None of these approaches have been totally successful, and devices that do significantly reduce the recombination rate are difficult to fabricate and expensive to manufacture.

Finally, a third major problem associated with conventional solar cells is the difficulty of fabrication. Typically, silicon or gallium arsenide cells must be grown over a long period of time in a highly controlled environment, and doping levels must be carefully monitored as the crystal is pulled from the base.

SUMMARY OF THE INVENTION

In accordance with the present invention, a photovoltaic battery is provided which comprises a body of a photoactive material disposed between first and second layers of material which are ionically conductive with respect to ions released during the photoreaction. The second layer of ionically conductive material has a higher concentration in ions than the first layer, so there is a difference in chemical potential between the two layers which induces an electric field through the photoactive body oriented toward the second layer of ionically conductive material. This second layer acts as the negative electrode of the battery and the first layer of ionically conductive material is disposed against an electronic conductor which acts in conjunction therewith as the positive electrode. The photoactive body is low in electronic conductivity and acts as an electrolyte disposed between the two electrodes. For purposes of this invention, the term "electrical" as applied to conductor or conductivity refers to either ionic or electronic conduction, or both, whereas the term "electronic" refers to electronic conduction only and not ionic conduction. In the storage mode, the photochemical reaction between the photoactive material and photons releases electrons and positive ions from the photoactive body, the positive ions being attracted toward the second layer of ionically conductive material by virtue of the electric field. The positive ions combine with the material of the second layer by virtue of the high ionic conductivity of the material. The electrons may be trapped at the interface of the photoactive body and the second layer of ionically conductive material or may enter the ionically conductive material of the second layer without chemically reacting therewith. Thus, no recombination between the electrons and the ions is permitted. In the discharge mode, upon attaching the positive and negative electrodes to a load resistance, the second layer of ionically conductive material releases the ions it has stored and these ions recombine in the body of photoactive material. The photocell therefore comprises a photovoltaic battery which is charged by the reaction between the photoactive body and photons, and stores its own energy. The photovoltaic battery is readily fabricated by depositing the various layers of material on a suitable substrate using well known techniques, such as chemical vapor deposition, for example. Moreover, the fabrication process may be completed in a relatively short period of time as contrasted to the fabrication of conventional photocells since the fabrication of a photovoltaic battery as disclosed herein does not require the growth of crystal structures in a highly controlled environment or the close monitoring of doping levels associated with conventional silicon or gallium arsenide solar cells.

BRIEF DESCRIPTION OF THE DRAWINGS

In order that the invention may be more readily understood and put into effect, embodiments thereof will be described in greater detail with reference to the drawings wherein.

DETAILED DESCRIPTION OF THE DRAWINGS

Figure 1:
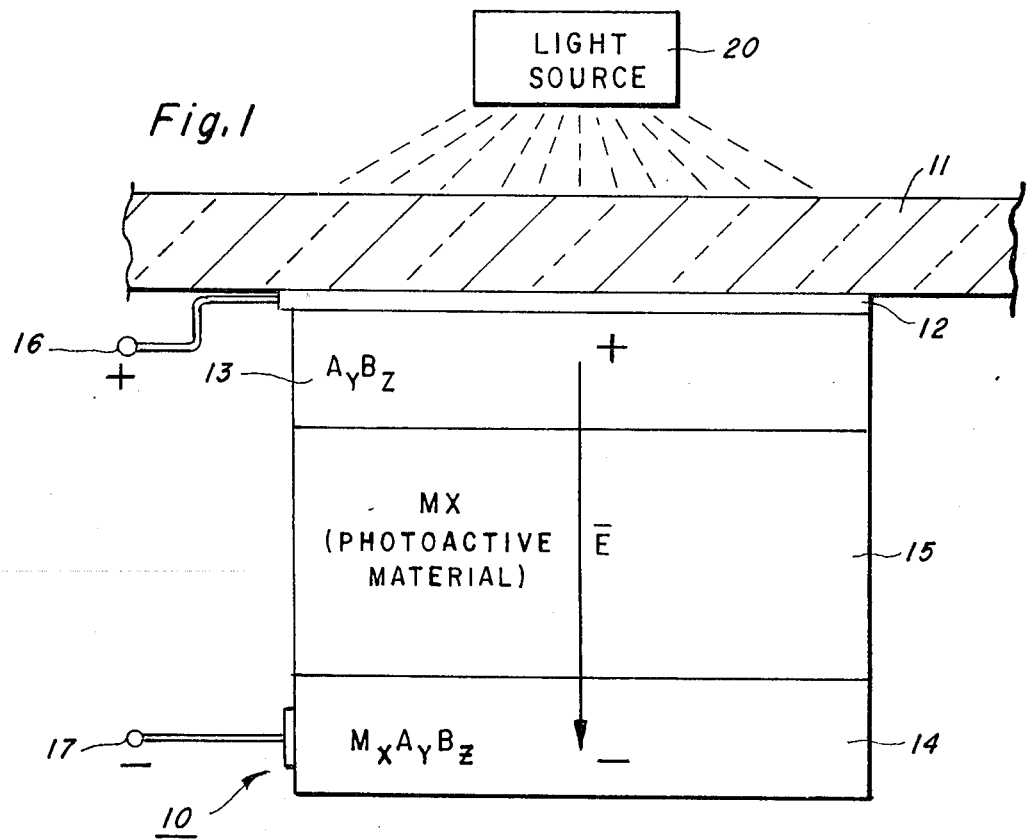
FIG. 1 is a cross sectional view, partially diagrammatic in form, of a first embodiment of a photovoltaic battery in accordance with the present invention.

Referring now to FIG. 1, a transparent substrate 11 has disposed along one of its planar surfaces a photovoltaic battery 10 comprising a preferred embodiment of the present invention. Although only one photovoltaic battery 10 is depicted in FIG. 1, it is to be understood that many such devices may be fabricated on the substrate 11. The substrate 11 may be any suitable material which is transparent to light, glass being one example thereof. The photovoltaic battery 10 comprises a layer or body 12 of transparent electronically conductive material, first and second layers 13 and 14 of ionically conductive material, and a body 15 of photoactive material interposed between the first and second ionically conductive layers 13 and 14. The body of transparent electronically conductive material 12 is disposed along one of the planar surfaces of the substrate 11. The transparent electronically conductive layer 12 acts in conjunction with the first layer 13 of ionically conductive material as the positive electrode of the battery 10. One example of a suitable transparent electronically conductive material for the layer 12 is tin dioxide ($SnO_2$). The transparent electronically conductive layer 12 may be formed on the transparent substrate 11 by means of pyrolytic or plasma deposition, or any other such suitable technique. The first layer 13 of ionically conductive material is disposed on the other planar surface of the electronically conductive layer 12, the material of the first layer being transparent to light. The material of the first layer 13 acts as the interface between the body of transparent electronically conductive material 12 and the photoactive body 15, and must be a good ionic conductor in order to avoid metal plating thereof during the discharge mode of the battery 10, as will be described in more detail hereinafter. The general chemical composition of the material of the first layer 13 may be represented by the formula $A_y B_z$, where the subscript $y$ represents the number of atoms of element A and the subscript $z$ represents the number of atoms of element B in the material. The material of first layer 13 may be a transition metal oxide, examples of which are vanadium oxide ($V_2O_5$), tungsten oxide ($WO_3$) and molybdenum oxide ($MoO_3$). The body of photoactive material 15 is disposed along the other planar surface of the ionically conductive first layer 13. The photoactive material of the body 15 acts as an electrolyte in the battery 10 and is a relatively poor electronic conductor. The material of the photoactive body 15 may be any suitable material such as a photoactive salt of a group I metal, the general chemical composition of which may be represented by the formula MX where M is typically a group I metal and X is a group VII element. Examples of such photoactive salts are silver iodide (AgI), copper iodide (CuI), silver bromide (AgBr) and copper bromide (CuBr). The second layer 14 of ionically conductive material is disposed along the other planar surface of the photoactive body 15 which is thereby sandwiched between the first and second layers 13 and 14 of ionically conductive material. The ionically conductive material of the second layer 14 need not be transparent to light. The second layer 14 of ionically conductive material acts as the negative electrode of the photovoltaic battery 10, and has good electronic conductivity. The general chemical composition of the ionically conductive material of the second layer 14 may be represented by the formula $M_x A_y B_z$, where the elements A and B are the same elements comprising the ionically conductive material of the first layer 13 and M is the element, typically a group I metal, found in the photoactive material of the body 15. The subscript $x$ represents the initial number of element M ions in the ionically conductive material of the second layer 14. Subscript $x$ must be greater than 0 in order to induce a voltage across the material of the photoactive body 15, but must be less than 1 since the material of the second layer 14 must be ionically conductive. Examples of materials suitable for use as the ionically conductive second layer 14 are $Ag_x V_2 O_5$ (known in the art as silver vanadium bronze), where $x = 0.35$, and $Cu_x WO_3$ (known in the art as copper tungsten bronze). Electrical contacts 16 and 17 are respectively provided for the positive and negative electrodes of the battery 10 to permit electrical access thereto, the contact 16 being electrically connected to the electronically conductive layer 12 of the positive electrode which includes the first ionically conductive layer 13 and the contact 17 being electrically connected to the ionically conductive second layer 14 which comprises the negative electrode. The contacts 16 and 17 comprise the positive and negative terminals or poles of the battery 10. As shown in FIG. 1, an electric field E is induced, by virtue of the difference in chemical potential between the ionically conductive first layer 13 and the ionically conductive second layer 14, across the body of photoactive material 15, the field being oriented toward the second layer of ionically conductive material 14. In the latter respect, the ionic conductivity of the second layer 14 is relatively high as compared to that of the first layer 13. The electric field E is a function of $x$, the number of M ions contained in the material of the second layer 14. The photoactive material of the body 15 is a poor electrical conductor so that it may act as a solid electrolyte without disabling the electric field E. Thus, a photovoltaic battery 10 is formed, in which the photoactive body 15 acts as an electrolyte disposed between the positive electrode, the ionically conductive first layer 13 in conjunction with the electronically conductive layer 12, and the negative electrode, the ionically conductive second layer 14. Upon exposure to a visible light source 20 incident on the transparent substrate 11 and the transparent electronically conductive layer 12, the photovoltaic battery 10 is operable to generate and store its own energy in a storage mode.

Figure 2:
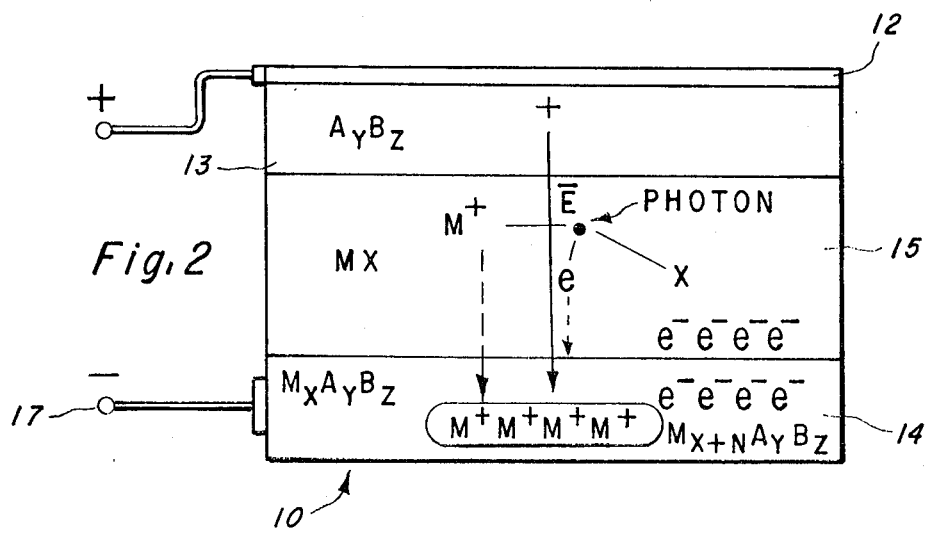
FIG. 2 is an enlarged cross sectional view of the first embodiment of the photovoltaic battery shown in FIG. 1, and illustrating the operation thereof in a storage mode.

The operation of the battery 10 during the storage mode is illustrated in FIG. 2. The photochemical reaction between the photoactive body 15 and photons emanating from the light source 20 results in the formation of cations $M^+$, electrons $e^-$ and element X. Electric field E, which is indicated by the directional arrow in FIG. 2, is induced by the difference in chemical potential between the first layer 13 of ionically conductive material and the second layer 14 of ionically conductive material, and forces cations $M^+$ toward the second layer 14. Because the material of the second layer 14 is high in ionic conductivity with respect to element M ions, cations $M^+$ are absorbed into the material of the second layer 14, the new chemical composition of which may be represented by the formula $M_{x+n} A_y B_z$, where the $n$ represents the number of cations $M^+$ absorbed by the material of the second layer 14 during the storage mode. The electrons $e^-$ may follow cations $M^+$ to the interface between the photoactive body 15 and the ionically conductive second layer 14 and become trapped at the interface or may physically enter the second layer 14, but do not chemically react therewith because of the absorption of the ions $M^+$ into the ionically conductive material of the second layer 14. The result is a stored charge which is a function of $n$, the number of cations $M^+$ absorbed by the ionically conductive material of the second layer 14. Thus, a battery 10 which may be charged by the reaction of the photoactive material of the body 15 with light has been produced. The battery 10 may be recharged in this manner by any light source 20 having the property that product $h\nu$ is greater than the bandgap of the photoactive material of the body 15, where $h$ is Planck's constant and $\nu$ is the frequency of light produced by the light source 20.

Figure 3:
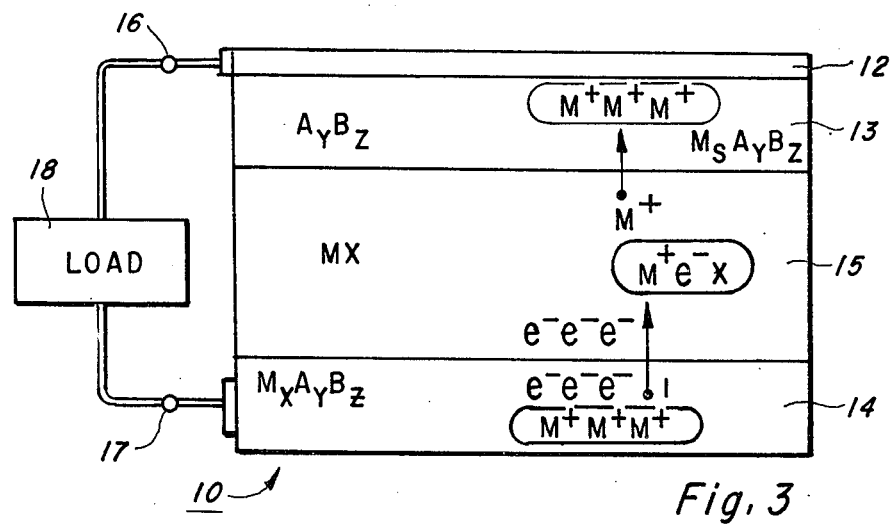
FIG. 3 is an enlarged cross sectional view similar to FIG. 2, but illustrating the operation of the photovoltaic battery in a discharge mode.

The operation of the battery 10 during a discharge mode is illustrated in FIG. 3. As shown in FIG. 3, when the terminals 16 and 17 of the battery 10 are connected to a load 18, electrons $e^-$ travel from the ionically conductive second layer 14 to the electronically conductive layer 12 via the load 18, thereby producing a current I across the load 18. Cations $M^+$ leave the ionically conductive second layer 14, re-enter the body of photoactive material 15 and recombine therewith. The number of cations $M^+$ trapped in the ionically conductive second layer 14 and, concommitantly, the strength of the electric field E, are thus progressively reduced as the battery 10 is discharged across the load 18. As shown in FIG. 3, if the battery 10 is over-discharged, cations $M^+$ may begin to enter the ionically conductive first layer 13, so that the new chemical composition of this layer may be described by the formula $M_sA_yB_z$, where the subscript $s$ represents the number of cations $M^+$ absorbed into the ionically conductive first layer 13 when over-discharge occurs. Since the electric field E is a function of $x-s$, the difference in chemical potential caused by the difference in the number of ions $M^+$ in the second and first layers 14 and 13 of ionically conductive materials respectively, when this difference attains the value of 0, the electric field E would be eliminated. Both the flow of cations $M^+$ into the ionically conductive first layer 13 and the flow of current I across the load 18 would then cease until the battery 10 is recharged. It is thus seen that first layer of material 13 must be ionically conductive with respect to $M^+$ ions, since the alternative would be plating of the cations $M^+$ along the interface between the first layer 13 of ionically conductive material and the photoactive body 15. The formation of a plating would interrupt the transmission of light from the source 20 and destroy the photo cell.

A particular photovoltaic battery structure in accordance with the preferred embodiment of the present invention has been constructed utilizing Corning No. 583801-0211-01 microsheet as substrate 11, this glass being commercially available from Corning Glassware, Incorporated. This glass has a thickness of approximately 30 mils and has predisposed along one of its major planar surfaces a 2,400 Å thick layer of tin dioxide, which is utilized as electronically conductive layer 12 in FIG. 1. A layer of vanadium oxide ($V_2O_5$) was utilized as the first layer 13 of ionically conductive material, this layer being evaporated on body 12 for approximately 20 minutes at a temperature of approximately 700° C., the resulting layer being approximately 1 micron in thickness. Next a body of silver bromide (AgBr) was evaporated on layer 13 for approximately 15 minutes at a temperature of approximately 450° C., the resulting layer being approximately 2 microns in thickness. The silver bromide layer acts as the body 15 of photoactive material in the photovoltaic battery of FIG. 1. A layer of silver vanadium bronze ($Ag_xV_2O_5$, $x = 0.35$) was utilized as the second layer 14 of ionically conductive material, this layer being evaporated on body 15 for approximately 30 minutes at a temperature of approximately 800° C., the resulting layer being approximately 1 micron in thickness. Finally, silver paint was disposed on the planar surface of the silver vanadium bronze layer opposite the planar surface contacting the body of silver bromide, and silver paint was disposed on the tin dioxide layer, the former acting as negative terminal 17 in FIG. 1 and the latter acting as positive terminal 16 in FIG. 1. Vanadium oxide and silver vanadium bronze are layered structures having ionic conduction only in the [001] plane, and, in order to make the photovoltaic battery operate in accordance with the description accompanying FIGS. 1-3, these layers were evaporated at an angle of 45° in order to obtain a component of ionic conduction in the vertical direction, so that electric field E could operate to charge and discharge the battery as described in FIGS. 2 and 3. This photovoltaic battery was found to charge when exposed to visible light and maintain the stored charge even when kept in a darkened area for several days.

Figure 4:
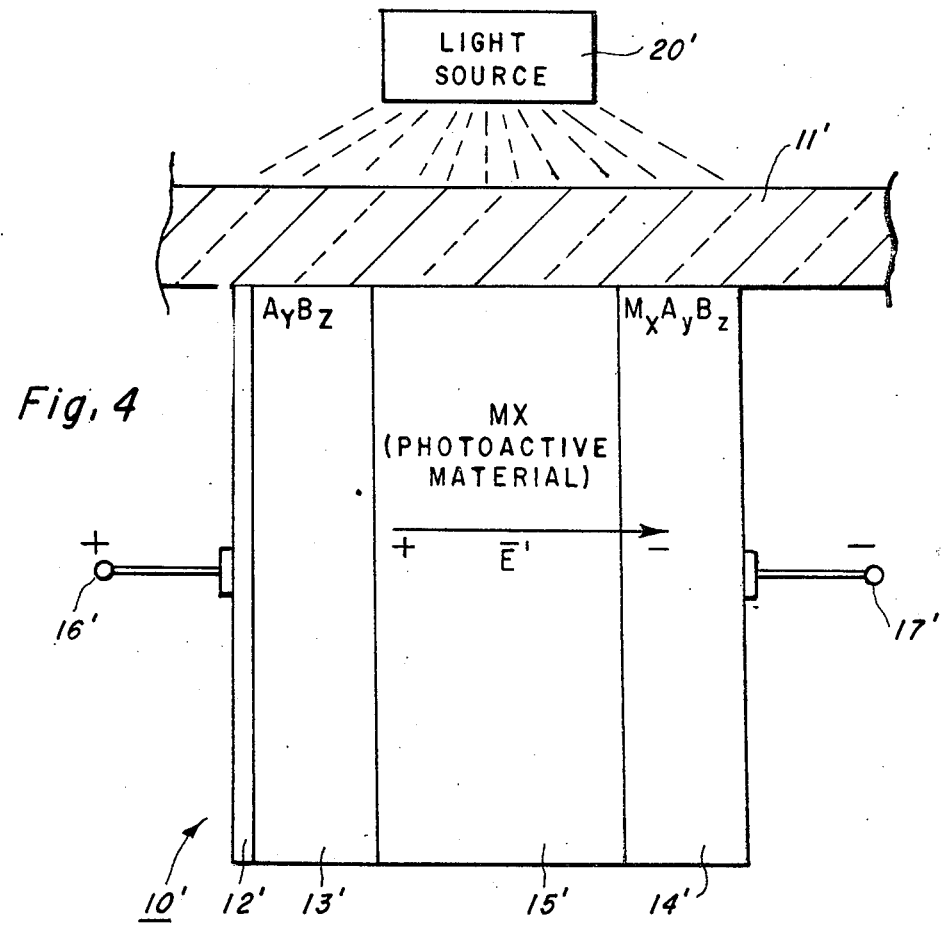
FIG. 4 is a cross sectional view of a second embodiment of the photovoltaic battery in accordance with the present invention.

A second embodiment of the photovoltaic battery of the present invention is illustrated in FIG. 4. Elements in FIG. 4 have been given the same reference numerals with the prime notation added as the reference numerals identifying corresponding elements in the embodiment of FIGS. 1-3 to avoid repetitive description. In the second embodiment, the photovoltaic body 15' is disposed between first and second layers of ionically conductive materials 13' and 14' respectively. The first layer 13' is disposed against the layer or body of electronically conductive material 12' which coacts therewith to provide the positive electrode of the battery 10'. The second layer 14' serves as the negative electrode. In this embodiment, however, the electronically conductive layer 12', the first layer of ionically conductive material 13', the photoactive body 15' and the second layer of ionically conductive material 14' are not disposed on the transparent substrate 11' in successive layers, but instead each of the aforementioned layers of material directly contact the substrate 11, with the layers being disposed in side by side relationship. The photoactive body 15' is directly exposed to the light source 20', so that the electronically conductive layer 12' and the ionically conductive first layer 13' are not required to be transparent to visible light. This embodiment has several advantages. First, should compounds having only one dimensional ionic conductivity be used for the first and second layers of ionically conductive material 13' and 14', no special fabrication procedure would be required, since the conduction paths of the $M+$ ions would be in horizontal direction and, as indicated in FIG. 4, the electric field E' is oriented in a horizontal direction in this embodiment. Another advantage realized by the embodiment of FIG. 4 is that, since light from the source 20' impinges directly on the photoactive material of the body 15', through the transparent substrate 11', the electronically conductive layer 12' and the first layer 13' of ionically conductive material are not required to be transparent to light. This enables use of a less restricted class of compounds in the construction of the photovoltaic battery 10' of the second embodiment.

While the invention has been described with reference to specific embodiments, the concept of the invention may be utilized in other embodiments and the description herein should therefore not be interpreted in a restrictive manner.

What is claimed is:

1. A photovoltaic battery capable of generating and storing its own energy when exposed to a light source, comprising in combination:

a body of a photoactive material having a general chemical composition represented by the formula MX, where M is a positive ion and X is a negative ion, and which releases a positive ion M+ in response to its exposure to a light source, a first layer of material which is ionically conductive with respect to the positive ion releasable by said photoactive body, said first layer being disposed against one surface of said photoactive body and having a general chemical composition represented by the formula $A_yB_z$, where the subscript $y$ represents the number of atoms of element A and the subscript $z$ represents the number of atoms of element B, a second layer of electrically conductive material which is ionically conductive with respect to the positive ion releasable by said photoactive body and of relatively higher ionic concentration as compared to said first layer, said second layer being disposed against a surface of said photoactive body opposite from said one surface thereof and having a general chemical composition represented by the formula $M_xA_yB_z$, where M is the same ion found in the photoactive material of said photoactive body, A and B are the same elements comprising the ionically conductive material of said first layer, and the $x$, $y$ and $z$ subscripts respectively represent the number of atoms of M, A and B where $0 < x < 1$, and a body of electronically conductive material disposed against said first layer.

2. A photovoltaic battery as set forth in claim 1 wherein said first layer is transparent to light.

3. A photovoltaic battery as set forth in claim 1 wherein said electronically conductive body is transparent to light.

4. A photovoltaic battery as set forth in claim 1 wherein said first layer and said electronically conductive body are transparent to light.

5. A photovoltaic battery as set forth in claim 1, further including a body of transparent substrate material, and said body of electronically conductive material, said first layer of ionically conductive material, said body of photoactive material, and said second layer of ionically conductive material being respectively disposed in successive layers on said body of transparent substrate material.

6. A photovoltaic battery as set forth in claim 1, further including a body of transparent substrate material, and said body of electronically conductive material, said first layer of ionically conductive material, said body of photoactive material, and said second layer of ionically conductive material being disposed in side by side relationship on the same surface of said body of transparent substrate material.

7. A photovoltaic battery as set forth in claim 1, wherein

MX is a photoactive salt of a group I metal, $A_yB_z$ of said first layer is a transition metal oxide which is ionically conductive with respect to said group I metal, and $M_xA_yB_z$ of said second layer comprises a group I metal combined with a transition metal oxide, wherein the group I metal is the same as that in the material of said photoactive body and the transition metal oxide is the same composition as the material of said first layer.

8. A photovoltaic battery as set forth in claim 7, wherein
the photoactive salt of a group I metal comprising the material of the photoactive body is taken from the group consisting of silver iodide, copper iodide, silver bromide and copper bromide.

9. A photovoltaic battery as set forth in claim 7, wherein
the transition metal oxide material of said first layer is taken from the group consisting of vanadium oxide, tungsten oxide and molybdenum oxide.

10. A photovoltaic battery as set forth in claim 7, wherein
the material of which said second layer is made is taken from the group consisting of silver vanadium bronze, copper vanadium bronze, copper tungsten bronze, silver tungsten bronze, copper molybdenum bronze and silver molybdenum bronze and including the same group I metal of the photoactive salt of said photoactive body.

11. A photovoltaic battery capable of generating and storing its own energy when exposed to a light source, comprising in combination:

a photoactive body made of a photoactive salt of a group I metal which releases a positive ion in response to its exposure to a light source, a first layer made of a transition metal oxide which is ionically conductive with respect to the positive ion releasable by said photoactive body, said first layer being disposed against one surface of said photoactive body, a second layer of electrically conductive material which is ionically conductive with respect to the position ion releasable by said photoactive body and of relatively higher ionic concentration as compared to said first layer, said second layer being disposed against a surface of said photoactive body opposite from said one surface thereof and being made of a material taken from the group consisting of $Ag_xV_2O_5$, known as silver vanadium bronze, $Cu_xV_2O_5$, known as copper vanadium bronze, $Cu_xWO_3$, known as copper tungsten bronze, $Ag_xWO_3$, known as silver tungsten bronze, $Cu_xMoO_3$, known as copper molybdenum bronze, and $Ag_xMoO_3$, known as silver molybdenum bronze, wherein $0 < x < 1$ and the material includes the same group I metal included in the photoactive salt of said photoactive body, and a body of electronically conductive material disposed against said first layer.

12. A photovoltaic battery as set forth in claim 11, wherein said first layer of ionically conductive material is $V_2O_5$, known as vanadium oxide, said body of photoactive material is AgBr, known as silver bromide, and said second layer of ionically conductive material is $Ag_xV_2O_5$, known as silver vanadium bronze, wherein $0 < x < 1$.

13. A photovoltaic battery as set forth in claim 12, wherein $x = 0.35$.

* * * * *